United States Patent [19]

Takashima et al.

[11] Patent Number: 5,065,027

[45] Date of Patent: Nov. 12, 1991

[54] ELECTROMAGNETIC LENS

[75] Inventors: Susumu Takashima; Kunihiko Uchida, both of Tokyo, Japan

[73] Assignee: Jeol Ltd., Tokyo, Japan

[21] Appl. No.: 613,394

[22] Filed: Nov. 15, 1990

[30] Foreign Application Priority Data

Nov. 16, 1989 [JP] Japan ................................. 1-298566

[51] Int. Cl.$^5$ .......................................... H01J 37/141
[52] U.S. Cl. .......................... 250/356 ML; 313/361.1
[58] Field of Search .................... 250/396 R, 396 ML; 313/361.1

[56] References Cited

U.S. PATENT DOCUMENTS 3,659,095  4/1972  Gumenjuk et al. ......... 250/396 ML
3,707,628 12/1972  Bassett et al. ............... 250/49.5 PE Primary Examiner—Bruce C. Anderson
Attorney, Agent, or Firm—Webb, Burden, Ziesenheim & Webb

[57] ABSTRACT

There is disclosed a conical electromagnetic lens whose spherical aberration and chromatic aberration coefficients can be made small if the apex angle of the conical lens is small. The lens comprises a conical bobbin through which a beam of charged particles passes and a coil wound on the outer periphery of the bobbin. The number of turns of the coil per unit length along the axis of the lens is increased from the inlet end toward the exit end of the lens.

7 Claims, 2 Drawing Sheets

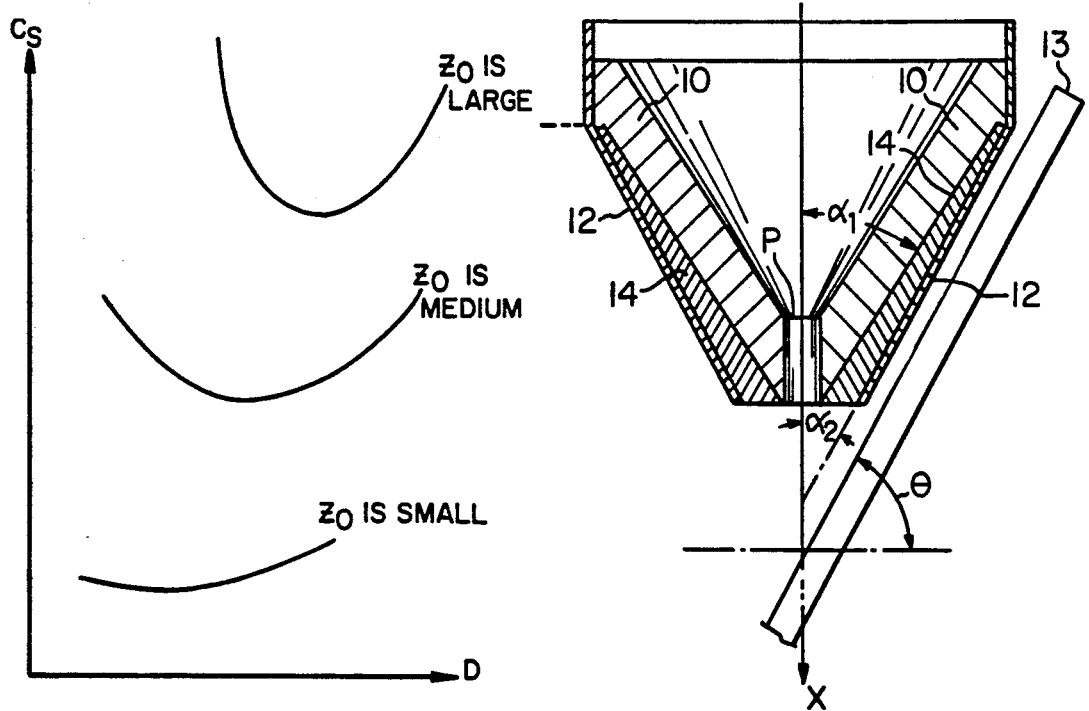
FIG. 3
FIG. 4
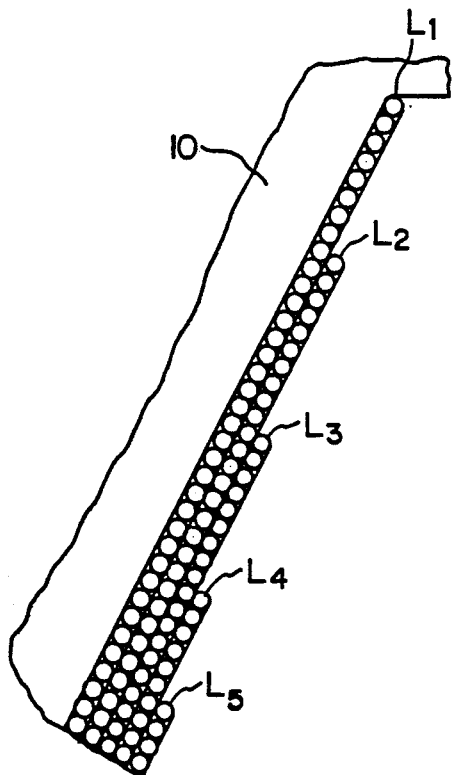
FIG. 5
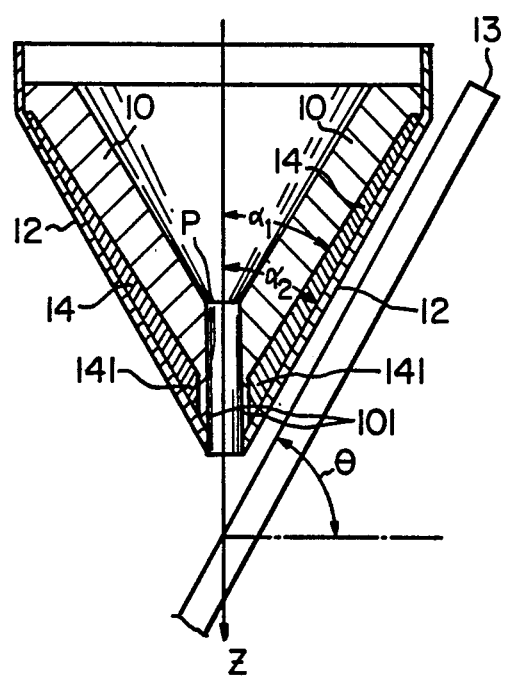
FIG. 6

ELECTROMAGNETIC LENS

BACKGROUND OF THE INVENTION

The present invention relates to an electromagnetic lens for focusing a charged-particle beam such as an electron beam and, more particularly, to improvements in a conical electromagnetic lens.

U.S. Pat. No. 3,707,628 discloses a conical electromagnetic lens of the construction shown in FIG. 1. This lens comprises a conical bobbin 10, a coil 11 wound around the bobbin, and a shroud 12 surrounding the outside of the coil. A beam of charged particles passes through the bobbin 10 along its axis Z. Where this lens is used as the objective lens of a scanning electron microscope, a specimen 13 is placed below the lens. The bobbin 10 is made from a nonmagnetic substance, while the shroud 12 is made from a ferromagnetic substance.

In the conical lens of this structure, a space for installing a detector acting to detect secondary electrons, reflected electrons, or X-rays emitted from the specimen is created close to the lens and, therefore, it is easy to detect the above-described secondary electrons, and so on. Even if the specimen 13 is tilted at the maximum angle, the specimen can be brought close to the principal plane of the lens, thus enabling high-resolution observation. Consequently, this lens is adapted for use in a scanning electron microscope where a flat specimen having a large area, such as a silicon wafer, is tilted for observation.

The coil 11 described above is composed of a conductor wire that is wound on the bobbin with a uniform radial thickness d. That is, the number of turns per unit length along the axis Z of the coil is constant. The lens having this coil 11 shows an axial magnetic field distribution as shown in FIG. 2(a), where the broken line shows the orbit of an electron beam incident on the lens parallel to the axis Z.

In this conical lens, if the half conical angle $\alpha$ is made small to permit the tilt angle $\theta$ of the specimen to be made larger, e.g., larger than 60°, then it is impossible to reduce the distance $Z_o$ between the position of the principal plane of the lens and the specimen below a certain value. This, in turn, makes it impossible to decrease the spherical aberration coefficient $C_s$ and the chromatic aberration coefficient $C_c$ of the lens below certain values.

These problems are described now in detail. In order to investigate the spherical aberration coefficient $C_s$ of the electromagnetic lens, the present inventors calculated the relation of the spherical aberration coefficient $C_s$ of the lens to the half-value width D of the axial magnetic field distribution, using the distance $Z_o$ between the principal plane of the lens and the focal point, or the position of the specimen, as a parameter. FIG. 3 is a graph diagrammatically showing the results of the calculation. It can be seen from FIG. 3 that (1) the distance $Z_o$ should be made as small as possible to reduce the spherical aberration coefficient $C_s$ and that (2), where the distance $Z_o$ assumes a certain value, the half-value width D should be so selected as to minimize the value of the coefficient $C_s$.

With respect to the requirement (1), the chromatic aberration coefficient $C_c$ corresponds to the distance $Z_o$ and so reducing the distance $Z_o$ is also effective in reducing the chromatic aberration coefficient $C_c$. With respect to requirement (2), if the distance $Z_o$ is made small, then it is necessary to reduce the half-value width D, as can be seen from FIG. 3.

We now discuss the conical lens shown in FIG. taking account of these facts. Since the position at which the axial magnetic field strength assumes its maximum value is located at a relatively high position, it is difficult to reduce the distance $Z_o$. Therefore, a limit is set to reduction in the coefficient $C_c$. In order to adjust the half-value width D, it is desired to make the distribution of the axial magnetic field adjustable, but this is achieved only by adjusting the length of the coil, or the dimension taken along the Z axis. Thus, there exists only a small degree of freedom. Furthermore, it is difficult to reduce the width D itself below a certain value.

SUMMARY OF THE INVENTION

It is an object of the present invention to provide a conical electromagnetic lens whose spherical aberration and chromatic aberration coefficients can be made small if the half conical angle $\alpha$ is rendered small.

The above object is achieved by a conical electromagnetic lens comprising a conical bobbin through which a beam of charged particles passes and a coil wound on the outside of the bobbin, the coil being so designed that the number of turns per unit length along the axis of the lens is increased from the inlet end of the lens toward the exit end.

Other objects and features of the invention will appear in the course of the description thereof which follows.

BRIEF DESCRIPTION OF THE DRAWINGS

FIG. 3 is a graph in which spherical aberration coefficient $C_s$ is plotted against half-value width D, using the distance $Z_o$ as a parameter;

FIG. 4 is a vertical cross section of a conical electromagnetic lens according to the invention;

FIG. 5 is a fragmentary enlarged view of the bobbin of the lens shown in FIG. 4, for showing the manner in which the coil is wound; and FIG. 6 is a vertical cross section of another conical electromagnetic lens according to the invention.

DETAILED DESCRIPTION OF THE PREFERRED EMBODIMENTS

Referring to FIG. 4, there is shown a conical lens according to the invention. This lens comprises a conical bobbin 10, a coil 14 wound around the bobbin, and a shroud 12 surrounding the outside of the coil. The bobbin 10 has a port P through which a beam of charged particles enters the bobbin. The incident beam passes through the bobbin along the axis Z of the conical bobbin. A specimen 13 is placed in the focal point lying below the lens when this lens is used as the objective lens of a scanning electron microscope. The bobbin 10 is made from a nonmagnetic substance, while the shroud 12 is made from a ferromagnetic substance.

When the coil 14 is wound around the bobbin 10, the coil can be wound around the bobbin from a high position to a low position or vice versa to obtain the cross section shown in FIG. 4. If the coil is wound in plural layers as shown in FIG. 5, then it is easy to fabricate the winding. In particular, a conductor wire $L_1$ is wound from a low position to a high position to form the first layer. Then, less turns of a conductor wire $L_2$ are wound from the low position to a less high position to form a second layer $L_2$ The upper end of the second layer $L_2$ is shifted downward from the upper end of the first layer $L_1$ Similarly, conductor wires are coiled to form the third layer $L_3$, the fourth layer $L_4$, and so on such that the number or turns of each succeeding layer is reduced and that the upper end of each succeeding layer is shifted downward. The upper end of each layer is electrically connected with the lower end of the following layer through the gap between the coil and the shroud, so that the wires forming the layers are connected in series to thereby form one coil. When the coil produces a large amount of heat, the gap can be used as a passage through which a coolant for cooling the coil is caused to flow.

The number of turns per unit length of the coil 14 wound in this way along the axis Z of the coil as shown in FIG. 4 is increased in a stepwise fashion from the inlet end toward the exit end of the lens.

Expressed differently, the coil 14 is wound on the bobbin in such a way that the angle ($\alpha_1$) between the inner surface of the coil and the axis Z of the coil is larger than the angle ($\alpha_2$) between the outer surface of the coil and the axis Z.

Figure 1:
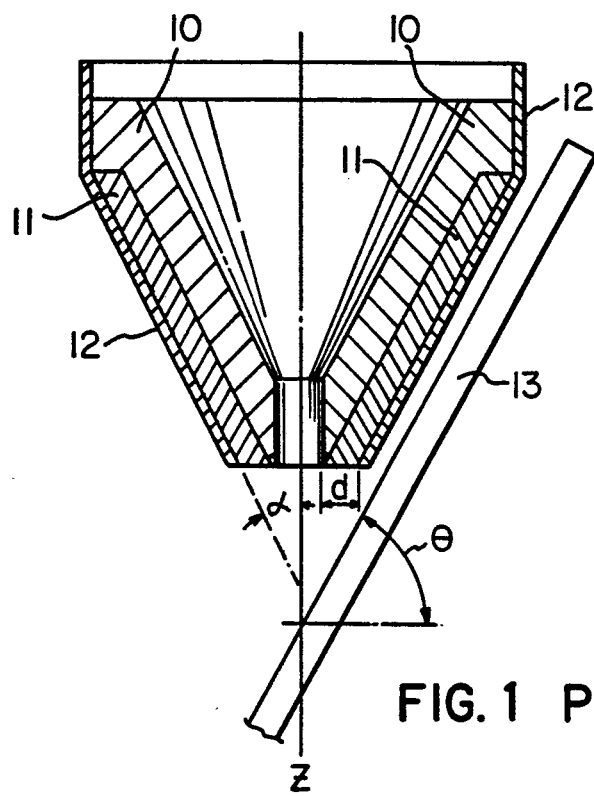
FIG. 1 is a vertical cross section of the prior art conical electromagnetic lens disclosed in U.S. Pat. No. 3,707,628.
Figures 2A, 2B, 2C:
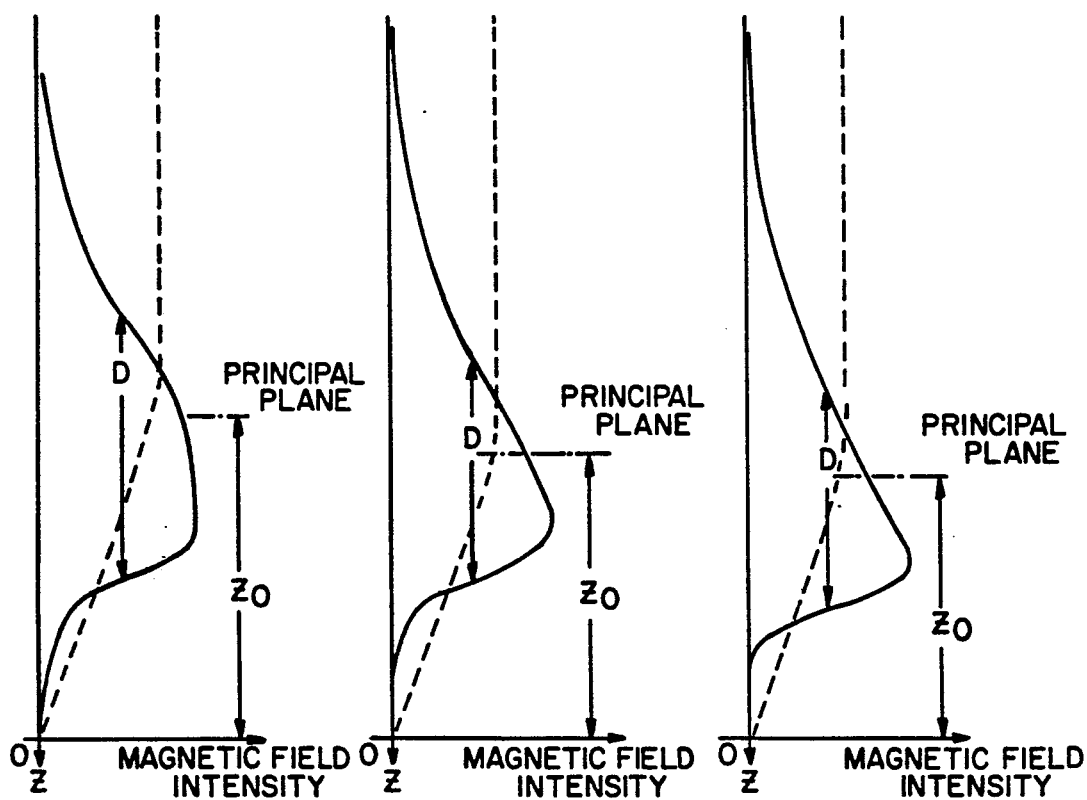
FIG. 2(a), 2(b), and 2(c) are graphs showing the axial magnetic field distributions and the orbits of the electron beams in the electromagnetic lenses shown in FIGS. 1, 4, and 6, respectively.

FIG. 2(b) shows the axial magnetic field distribution of the electromagnetic lens equipped with the coil 14 wound in this manner. Because the number of turns per unit length along the axis Z of the coil increases from the inlet end of the lens toward the exit end, the position at which the strength of the magnetic field is greatest is closer to the specimen that in FIG. 2(a). This enables the distance $Z_o$ to be reduced. Hence, the spherical aberration coefficient $C_s$ and the chromatic aberration coefficient $C_c$ can be decreased.

The angle $\alpha_2$ that the outer surface of the coil 14 forms with the axis Z can be adjusted by varying the manner in which the coil is wound. As a result, the distribution of the axial magnetic field, i.e., the position at which the half-value width and the axial magnetic field strength assume their maximum values, can be changed. Thus, the number of parameters capable of adjusting the distance $Z_o$ between the principal plane of the lens and the position of the specimen is increased. In addition, the half-value width is reduced compared with the case of FIG. 2(a), because the number of turns per unit length along the axis Z of the coil 14 is increased from the inlet end of the lens toward the exit end. Furthermore, the position at which the strength of the axial magnetic field is greatest is closer to the exit end of the lens than in the case of FIG. 2(b). Therefore, the distance $Z_o$ can be reduce further. Consequently, an electromagnetic lens having a further reduced spherical aberration coefficient $C_s$ can be realized.

Referring to FIG. 6, there is shown another conical lens according to the invention. This lens is similar to the lens already described except that the bobbin 10 has a cylindrically protruding front end portion 101 surrounding the axis Z. The coil 14 is wound up to this front end portion. The coil 14 is wound in the same way as in the previous example.

In this example, a coil 141 is wound on the front end portion 101. That is, the coil 141 is added to the lens shown in FIG. 4. Because of the contribution of the added coil 141, the axial magnetic field is distributed even closer to the exit end of the lens, which makes the distance $Z_o$ further smaller than in the case of FIG. 2(b). Consequently, the spherical aberration coefficient $C_s$ and the chromatic aberration coefficient $C_c$ can be reduced for the above-described reasons.

It is to be noted that the invention is not limited to the foregoing examples and that various modifications and changes are possible. For example, the cross sections of the conductor wires forming the coil may be circular or square in shape, or may take any other form. Also, the coil can be fabricated by winding a conductor in the form of tape.

Having thus described our invention with the detail and particularity required by the Patent Laws, what is claimed and desired to be protected by Letters Patent is set forth in the following claims.

What is claimed is:

1. An electromagnetic lens for focusing a beam of charged particles, comprising:
   a hollow conical bobbin through which the beam of charged particles passes generally along the axis of the bobbin which is also the axis of the lens, bobbin having an inlet end and a port at its apex to permit the beam to exit from the bobbin defining the outlet end; and
   a coil consisting of wires of a conductor wound around the outer periphery of the conical bobbin and about the axis of the bobbin, the number of turns of the coil per unit length along the axis of the lens being increased from the inlet end of the bobbin toward the exit end.

2. The electromagnetic lens of claim 1, wherein the coil is designed so that the angle $\alpha_1$ between the inner surface of the coil being nearest the axis of the bobbin and the axis of the conical bobbin is larger that the angle $\alpha_2$ between the outer surface of the coil being furthest from the axis of the bobbin.

3. The electromagnetic lens of claim 1 or 2, wherein the coil is wound on the outer periphery of the bobbin in plural layers consisting of different turns of wire.

4. The electromagnetic lens of any one of claims 1 or 2, wherein the outer surface of the coil being furthest from the axis of the bobbin is surrounded with a shroud made from a magnetic substance.

5. The electromagnetic lens of any one of claims 1 or 2, wherein said wires of a conductor are circular in cross section.

6. The electromagnetic lens of any one of claims 1 or 2, wherein said wires of a conductor are square in cross section.

7. The electromagnetic lens of any one of claims 1 or 2, wherein said wires of a conductor take the form of tape.

* * * * *

UNITED STATES PATENT AND TRADEMARK OFFICE
CERTIFICATE OF CORRECTION

PATENT NO. : 5,065,027

DATED : November 12, 1991

INVENTOR(S) : Susumu Takashima and Kunihiko Uchida

It is certified that error appears in the above-identified patent and that said Letters Patent is hereby corrected as shown below:

Front page, after Assignee: "Jeol Ltd." should read
--JEOL Ltd.--.

Column 1 Line 67 "$C_c$" should read --$C_c$.--.

Column 2 Line 3 after "FIG." insert --1,--.

Column 2 Line 36 "FIG." should read --FIGS.--.

Column 3 Line 6 "$L_2$" should read --$L_2$.--.

Column 3 Line 8 "$L_1$" should read --$L_1$.--.

Column 3 Lines 35-36 "that in
      FIG. 2(a)."
should read --than in FIG. 2(a).--.

Claim 2 Line 42 Column 4 "that" should read --than--.

Signed and Sealed this

Twenty-seventh Day of April, 1993

*Attest:*

MICHAEL K. KIRK

*Attesting Officer*     *Acting Commissioner of Patents and Trademarks*